US008971830B2

(12) United States Patent
Hadjichristos et al.

(10) Patent No.: US 8,971,830 B2
(45) Date of Patent: Mar. 3, 2015

(54) MULTI-MODE MULTI-BAND POWER AMPLIFIER MODULE

(75) Inventors: Aristotle Hadjichristos, Cary, NC (US); Puay Hoe See, San Diego, CA (US); Babak Nejati, San Diego, CA (US); Guy Klemens, San Diego, CA (US); Norman L Frederick, Jr., Vista, CA (US); Gurkanwal S Sahota, San Diego, CA (US); Marco Cassia, San Diego, CA (US); Nathan M Pletcher, Encinitas, CA (US); Yu Zhao, San Diego, CA (US); Thomas A Myers, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 725 days.

(21) Appl. No.: 12/575,414

(22) Filed: Oct. 7, 2009

(65) Prior Publication Data
US 2010/0291888 A1 Nov. 18, 2010

Related U.S. Application Data

(60) Provisional application No. 61/177,527, filed on May 12, 2009.

(51) Int. Cl.
*H01Q 11/12* (2006.01)
*H04B 1/04* (2006.01)
(Continued)

(52) U.S. Cl.
CPC ............ *H04B 1/0458* (2013.01); *H03F 1/0277* (2013.01); *H03F 3/24* (2013.01); *H03F 3/72* (2013.01); *H04B 1/0483* (2013.01); *H03F 2203/7236* (2013.01)
USPC .................................... 455/127.4; 455/552.1

(58) Field of Classification Search
USPC ................. 455/102, 129, 127.1–127.5, 552.1
See application file for complete search history.

(56) References Cited

U.S. PATENT DOCUMENTS 5,974,041 A 10/1999 Kornfeld et al.
6,069,525 A 5/2000 Sevic et al.
(Continued)

FOREIGN PATENT DOCUMENTS

CN 1272247 A 11/2000
CN 1388724 A 1/2003
(Continued)

OTHER PUBLICATIONS

International Search Report and Written Opinion—PCT/US2010/034621, International Search Authority—European Patent Office—Aug. 17, 2010.
(Continued)

*Primary Examiner* — Christian Hannon
(74) *Attorney, Agent, or Firm* — Ramin Mobarhan

(57) ABSTRACT

A multi-mode multi-band power amplifier (PA) module is described. In an exemplary design, the PA module includes multiple power amplifiers, multiple matching circuits, and a set of switches. Each power amplifier provides power amplification for its input signal when selected. Each matching circuit provides impedance matching and filtering for its power amplifier and provides a respective output signal. The switches configure the power amplifiers to support multiple modes, with each mode being for a particular radio technology. Each power amplifier supports at least two modes. The PA module may further include a driver amplifier and an additional matching circuit. The driver amplifier amplifies an input signal and provides an amplified signal to the power amplifiers. The additional matching circuit combines the outputs of other matching circuits and provides an output signal with higher output power. The driver amplifier and the power amplifiers can support multiple output power levels.

28 Claims, 9 Drawing Sheets

(51) Int. Cl.
*H03F 1/02* (2006.01)
*H03F 3/24* (2006.01)
*H03F 3/72* (2006.01)

(56) References Cited

U.S. PATENT DOCUMENTS

| | | | |
|---|---|---|---|
| 6,246,351 | B1 | 6/2001 | Yilmaz |
| 6,256,482 | B1 | 7/2001 | Raab |
| 7,532,679 | B2 | 5/2009 | Staszewski et al. |
| 2002/0097087 | A1 | 7/2002 | Petz et al. |
| 2002/0186076 | A1 | 12/2002 | Hareyama |
| 2004/0239428 | A1* | 12/2004 | Apel .................... 330/279 |
| 2005/0110565 | A1 | 5/2005 | Robinson |
| 2006/0194551 | A1 | 8/2006 | Sato et al. |
| 2007/0155345 | A1 | 7/2007 | Wiegner et al. |
| 2007/0222697 | A1* | 9/2007 | Caimi et al. .................... 343/861 |

FOREIGN PATENT DOCUMENTS

| | | |
|---|---|---|
| CN | 1983710 A | 6/2007 |
| EP | 0837559 | 4/1998 |
| EP | 1605589 | 12/2005 |
| GB | 359206 | 10/1931 |
| JP | 6507775 T | 9/1994 |
| JP | 07193442 | 7/1995 |
| JP | H11186921 A | 7/1999 |
| JP | H11234148 A | 8/1999 |
| JP | 2002353751 A | 12/2002 |
| JP | 2004036406 A | 2/2004 |
| JP | 2004364068 A | 12/2004 |
| JP | 2006270923 A | 10/2006 |
| TW | 200849839 A | 12/2008 |
| WO | 9318590 A1 | 9/1993 |
| WO | WO-9917445 A1 | 4/1999 |
| WO | WO0105028 | 1/2001 |
| WO | WO02103912 A1 | 12/2002 |
| WO | WO2004034603 | 4/2004 |
| WO | WO2007106460 | 9/2007 |

OTHER PUBLICATIONS

International Search Report and Written Opinion—PCT/US06/061124, International Searching Authority, European Patent Office, Mar. 13, 2008.

Taiwan Search Report—TW099115141—TIPO—May 30, 2013.

* cited by examiner

MULTI-MODE MULTI-BAND POWER AMPLIFIER MODULE

I. CLAIM OF PRIORITY UNDER 35 U.S.C. §119

The present Application for Patent claims priority to Provisional U.S. Application Ser. No. 61/177,527, entitled "MULTI-MODE MULTI-BAND POWER AMPLIFIER AND ANTENNA FRONT END MODULE," filed May 12, 2009, assigned to the assignee hereof, and expressly incorporated herein by reference.

BACKGROUND

I. Field

The present disclosure relates generally to electronics, and more specifically to a power amplifier (PA) module for a transmitter.

II. Background

In a wireless communication system, a transmitter may process (e.g., encode and modulate) data to generate output samples. The transmitter may further condition (e.g., convert to analog, filter, frequency upconvert, and amplify) the output samples to generate an output radio frequency (RF) signal. The transmitter may then transmit the output RF signal via a wireless channel to a receiver. The receiver may receive the transmitted RF signal and perform the complementary processing on the received RF signal. The receiver may condition (e.g., amplify, frequency downconvert, filter, and digitize) the received RF signal to obtain input samples. The receiver may further process (e.g., demodulate and decode) the input samples to recover the transmitted data.

The transmitter may support multiple modes and multiple frequency bands. Each mode may correspond to a different radio technology, and each frequency band may cover a different range of frequencies. The transmitter may include a number of power amplifiers to support the multiple modes and the multiple bands. For example, each power amplifier may support a specific mode on a specific band. A relatively large number of power amplifiers may then be required for the transmitter, which may increase size and cost of the transmitter.

DETAILED DESCRIPTION

The word "exemplary" is used herein to mean "serving as an example, instance, or illustration." Any design described herein as "exemplary" is not necessarily to be construed as preferred or advantageous over other designs.

A multi-mode multi-band power amplifier (PA) module capable of supporting multiple modes and multiple frequency bands is described herein. The PA module may be used for various electronics devices such as wireless communication devices, cellular phones, personal digital assistants (PDAs), handheld devices, wireless modems, laptop computers, cordless phones, Bluetooth devices, consumer electronics devices, etc. For clarity, the use of the PA module in a wireless communication device is described below.

Figure 1:
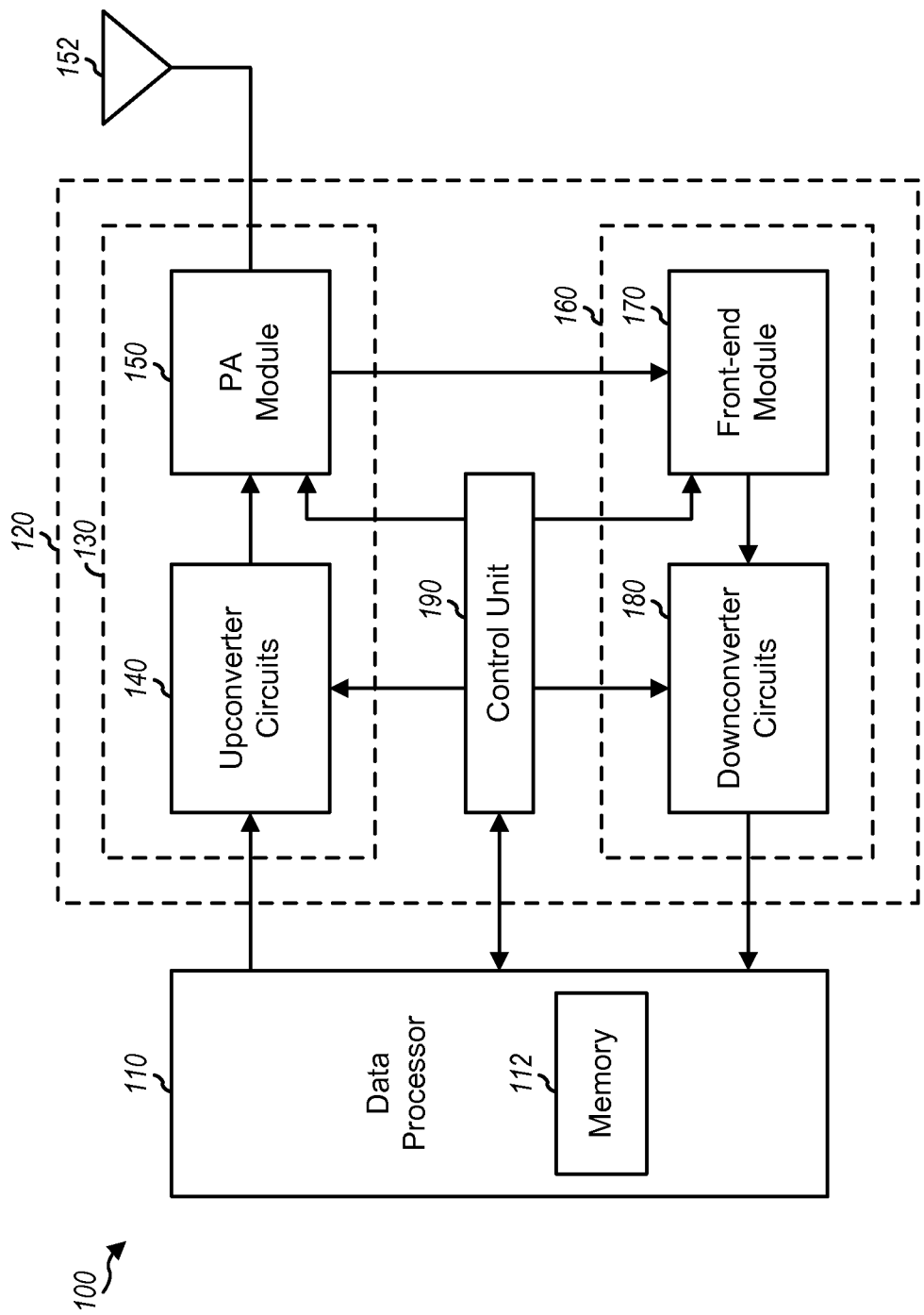
FIG. 1 shows a block diagram of a wireless communication device.

FIG. 1 shows a block diagram of an exemplary design of a wireless communication device 100. In this exemplary design, wireless device 100 includes a data processor 110 and a transceiver 120. Transceiver 120 includes (i) a transmitter 130 comprising upconverter circuits 140 and a PA module 150 and (ii) a receiver 160 comprising a front-end module 170 and downconverter circuits 180. In general, wireless device 100 may include any number of transmitters and any number of receivers for any number of communication systems and any number of frequency bands.

In the transmit path, data processor 110 may process data to be transmitted and provide an output baseband signal to transmitter 130. Within transmitter 130, upconverter circuits 140 may process (e.g., amplify, filter, and frequency upconvert) the output baseband signal and provide an input RF signal. Upconverter circuits 140 may include amplifiers, filters, mixers, etc. PA module 150 may amplify the input RF signal to obtain the desired output power level and provide an output RF signal, which may be transmitted via an antenna 152. PA module 150 may include driver amplifiers, power amplifiers, switches, etc., as described below.

In the receive path, antenna 152 may receive RF signals transmitted by base stations and/or other transmitter stations and may provide a received RF signal, which may be routed via PA module 150 and provided to receiver 160. Within receiver 160, front-end module 170 may process (e.g., amplify and filter) the received RF signal and provide an amplified RF signal. Front-end module 170 may include duplexers, low noise amplifiers (LNA), etc. Downconverter circuits 180 may further process (e.g., frequency downconvert, filter, and amplify) the amplified RF signal and provide an input baseband signal to data processor 110. Downconverter circuits 180 may include mixers, filters, amplifiers, etc. Data processor 110 may further process (e.g., digitize, demodulate, and decode) the input baseband signal to recover transmitted data.

A control unit 190 may receive control information from data processor 110 and may generate controls for the circuits and modules in transmitter 130 and receiver 160. Data processor 110 may also provide controls directly to the circuits and modules in transmitter 130 and receiver 160. In any case, the controls may direct the operation of the circuits and modules to obtain the desired performance.

FIG. 1 shows an exemplary design of transmitter 130 and receiver 160. In general, the conditioning of the signals in transmitter 130 and receiver 160 may be performed by one or more stages of amplifier, filter, mixer, etc. These circuit blocks may be arranged in various configurations. All or a portion of transmitter 130 and all or a portion of receiver 160 may be implemented on one or more analog integrated circuits (ICs), one or more RF ICs (RFICs), one or more mixed-signal ICs, etc. For example, PA module 150 may be implemented on one RFIC, and upconverter circuits 140 and downconverter circuits 180 may be implemented on another RFIC.

Data processor 110 may perform various functions for wireless device 100, e.g., processing for data being transmitted or received. A memory 112 may store program codes and data for data processor 110. Data processor 110 may be implemented on one or more application specific integrated circuits (ASICs) and/or other ICs.

Wireless device 100 may support multiple modes and multiple bands. PA module 150 may be designed to support all of the modes and bands supported by wireless device 100. The multiple modes may correspond to different radio technologies such as Code Division Multiple Access (CDMA) 1X, Wideband CDMA (WCDMA), Global System for Mobile Communications (GSM), Long Term Evolution (LTE), Wireless Local Area Network (WLAN), etc. Each mode may correspond to a particular radio technology, which may utilize frequency division duplexing (FDD) or time division duplexing (TDD). For FDD, different frequency channels are used for the downlink and uplink, and a duplexer may be used to route an output RF signal from a transmitter to an antenna and to route a received RF signal from the antenna to a receiver. For TDD, the same frequency channel is used for both the downlink and uplink, and a switch may be used to couple the transmitter to the antenna some of the time and to couple the receiver to the antenna some other time.

Figure 2:
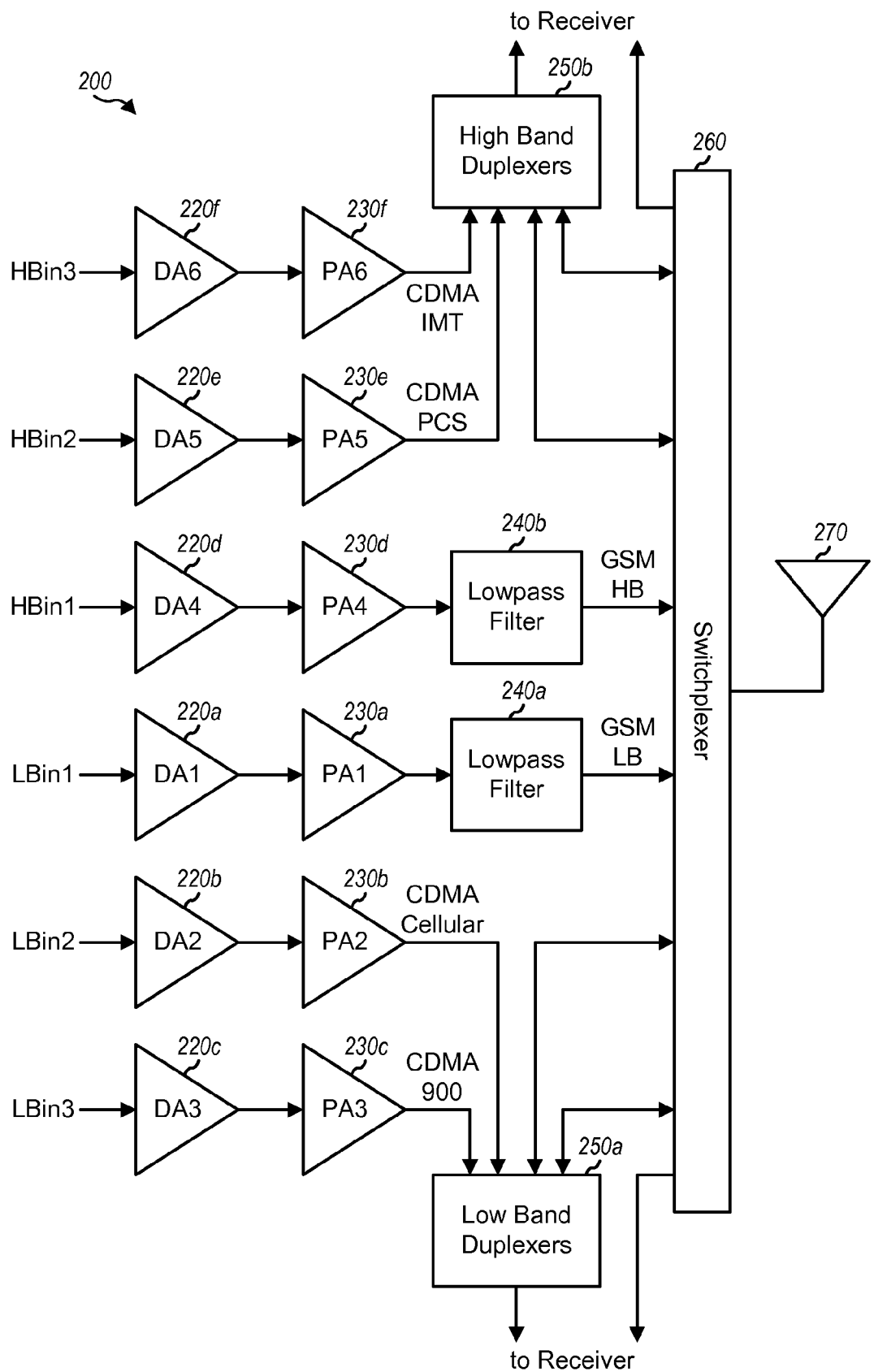
FIG. 2 shows a block diagram of an output circuit supporting three modes.

FIG. 2 shows a block diagram of an output circuit 200 that supports three modes and four bands. The three modes may be for CDMA 1X, WCDMA, and GSM. The four bands may be split into low band (LB) and high band (HB). Low band generally refers to lower frequencies whereas high band generally refers to higher frequencies. For example, low band may cover cellular band, GSM 900 band and/or other frequency bands. High band may cover PCS band, IMT-2000 band and/or other frequency bands. The frequencies for these various bands are known in the art.

As shown in FIG. 2, for low band, output circuit 200 includes (i) a driver amplifier (DA1) 220a, a power amplifier (PA1) 230a, and a filter 240a for GSM for low band, (ii) a driver amplifier (DA2) 220b and a power amplifier (PA2) 230b for CDMA for cellular band, and (iii) a driver amplifier (DA3) 220c and a power amplifier (PA3) 230c for CDMA for GSM 900 band. CDMA may include CDMA 1X, WCDMA, and/or other variants of CDMA. Each pair of driver amplifier 220 and power amplifier 230 may be designed to provide the required signal gain and output power level for the radio technology and band supported by that amplifier pair. CDMA has a maximum output power level of +27 dBm whereas GSM has a maximum output power level of +33 dBm. GSM power amplifier 230a may be a class C amplifier that can provide higher efficiency but may also generate more harmonic distortion due to operation in a saturated region. Filter 240a may perform filtering to attenuate undesired signal components at harmonic frequencies to enable conformance to GSM specifications. CDMA power amplifiers 230b and 230c may be class AB amplifiers due to the more stringent linearity requirements of CDMA and may generate less harmonic distortion. Duplexers 250a may perform harmonic rejection for CDMA. Duplexers 250a also route the output RF signals from power amplifiers 230b and 230c to a switchplexer 260 and further route received RF signals from switchplexer 260 to a receiver (not shown in FIG. 2).

For high band, output circuit 200 includes (i) a driver amplifier (DA4) 220d, a power amplifier (PA4) 230d, and a filter 240b for GSM for high band, (ii) a driver amplifier (DA5) 220e and a power amplifier (PA5) 230e for CDMA for PCS band, and (iii) a driver amplifier (DA6) 220f and a power amplifier (PA6) 230f for CDMA for IMT-2000 band. Duplexers 250b route the output RF signals from power amplifiers 230e and 230f to switchplexer 260 and also route received RF signals from switchplexer 260 to a receiver (not shown in FIG. 2). Switchplexer 260 routes one of its inputs to an antenna 270.

Output circuit 200 may be implemented with multiple modules. For example, driver amplifiers 220a and 220d and power amplifiers 230a and 230d for GSM may be implemented with one GSM PA module. Driver amplifiers 220b, 220c, 220e and 220f and power amplifiers 230b, 230c, 230e and 230f for CDMA may be implemented with one or more CDMA PA modules. Lowpass filters 240a and 240b and switchplexer 260 may be implemented with an antenna switch module. The PA modules and antenna switch module may be packaged separately. The use of multiple separately packaged modules may increase the size and cost of a wireless device using these modules.

In an aspect, a PA module may support multiple modes and multiple bands by having configurable power amplifiers and reusing each power amplifier to support more than one mode. The PA module may also integrate functions such as filtering, antenna switching, impedance matching, etc.

Figure 3:
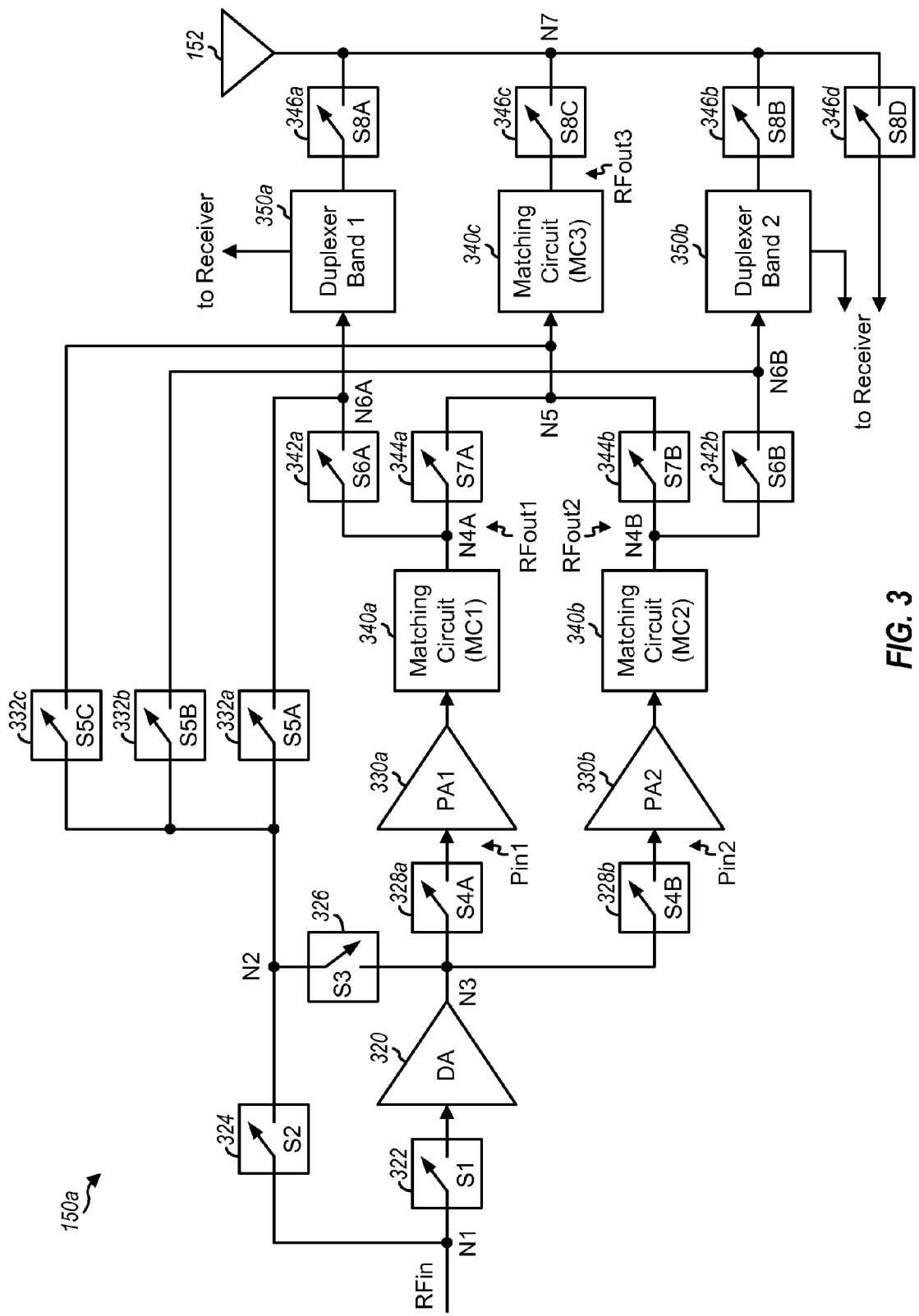
FIG. 3 shows a block diagram of a multi-mode multi-band PA module.

FIG. 3 shows a block diagram of an exemplary design of a multi-mode multi-band PA module 150a, which can support multiple modes and multiple bands. PA module 150a is an exemplary design of PA module 150 in FIG. 1.

Within PA module 150a, a switch (S1) 322 is coupled between node N1 and the input of a driver amplifier (DA) 320, and the output of driver amplifier 320 is coupled to node N3. An input RF signal (RFin) is provided to node N1. A switch (S2) 324 is coupled between nodes N1 and N2, and a switch (S3) 326 is coupled between nodes N2 and N3. A switch (S4A) 328a is coupled between node N3 and the input of a first power amplifier (PA1) 330a, and a switch (S4B) 328b is coupled between node N3 and the input of a second power amplifier (PA2) 330b. A first matching circuit (MC1) 340a is coupled between the output of power amplifier 330a and node N4A, and a second matching circuit (MC2) 340b is coupled between the output of power amplifier 330b and node N4B. Switches 332a, 332b and 332c (S5A, S5B and S5C) have one end coupled to node N2 and the other end coupled to nodes N6A, N6B and N5, respectively. Switches 342a and 344a (S6A and S7A) have one end coupled to node N4A and the other end coupled to nodes N6A and N5, respectively. Switches 342b and 344b (S6B and S7B) have one end coupled to node N4B and the other end coupled to nodes N6B and N5, respectively. A third matching circuit (MC3) 340c is coupled in series with a switch (S8C) 346c, and the combination is coupled between nodes N5 and N7.

A duplexer 350a for band 1 has its transmit port coupled to node N6A, its receive port coupled to a receiver (e.g., front-end module 170 in FIG. 1), and its common port coupled to node N7 via a switch (S8A) 346a. A duplexer 350b for band 2 has its transmit port coupled to node N6B, its receive port coupled to the receiver, and its common port coupled to node N7 via a switch (S8B) 346b. Bands 1 and 2 may correspond to cellular and GSM 900 bands in low band, PCS and IMT-2000 bands in high band, or some other pair of bands. A switch (S8D) 346d is coupled between node N7 and the receiver and may be used to support TDD for GSM. Antenna 152 is coupled to node N7.

Driver amplifier 320 and power amplifiers 330a and 330b may be implemented with various amplifier designs known in the art. Matching circuits 340a, 340b and 340c may be implemented as described below. The switches may be implemented with metal oxide semiconductor (MOS) switches, micro-electro-mechanical system (MEMS) switches, etc.

Driver amplifier 320 may be selected/enable to provide signal amplification or may be bypassed, as described below. Each power amplifier 330 may also be selected/enabled to provide power amplification or may be bypassed, as also described below. Matching circuit 340a may provide impedance matching for power amplifier 330a, and matching circuit 340b may provide impedance matching for power amplifier 330b. Matching circuits 340a and 340b may each provide a target output impedance, e.g., Zo=50 Ohms (Ω). Matching circuit 340c may provide impedance matching for matching circuits 340a and 340b when switches 344a and 344b are closed. For example, the impedance at node N5 may be equal to Zo/2 when switches 344a and 344b are closed, and matching circuit 340c may have an input impedance of Zo/2 and an output impedance of Zo. Matching circuits 340a, 340b and 340c may also provide filtering to attenuate undesired signal components at harmonic frequencies.

In general, PA module 150a may support any number of modes and any given mode. For example, PA module 150a may support CDMA 1X, WCDMA, GSM, LTE, WLAN, etc., or any combination thereof. PA module 150a may also support any number of bands and any given band. For example, PA module 150a may support (i) cellular band, GSM 900 band, and/or other bands for low band and/or (ii) PCS band, IMT-2000 band, and/or other bands for high band. PA module 150a may support all of the modes for low band or high band in FIG. 2.

In an exemplary design, PA module 150a may be configured via switches and control signals to support multiple mode/band configurations and multiple output power levels. Each mode/band configuration may cover one or more modes and one or more bands. Each mode/band configuration may be associated with zero, one or both power amplifiers 330 being used for that mode/band configuration. Each output power level in a given mode may be associated with a particular state (e.g., on or off) for each amplifier that may be used for that mode. Each amplifier may be (i) selected and operated in the on state to provide a non-zero gain in decibel (dB), or (ii) bypassed and operated in an off state to provide a gain of zero dB, or (iii) shut off completely and possibly provide negative gain in dB.

In an exemplary design, PA module 150a may support CDMA 1X, WCDMA, and GSM modes. Driver amplifier 320 may be used for all three modes. Power amplifier 330a may be used for CDMA for band 1 and GSM for bands 1 and 2. CDMA may include CDMA 1X and WCDMA. Power amplifier 330b may be used for CDMA for band 2 and GSM for bands 1 and 2. Bands 1 and 2 may correspond to cellular and GSM 900 bands, or PCS and IMT-2000 bands, or some other pair of bands. Power amplifiers 330a and 330b can each provide the maximum output power level for CDMA. Both power amplifiers 330a and 330b may be selected and their outputs may be combined to provide the higher maximum output power level for GSM.

Table 1 lists three mode/band configurations and the amplifiers that may be used for each mode/band configuration, in accordance with an exemplary design.

TABLE 1

Amplifiers for each Mode/Band Configuration

| CDMA Band 1 Configuration | CDMA Band 2 Configuration | GSM Configuration |
|---|---|---|
| Driver amplifier 320 | Driver amplifier 320 | Driver amplifier 320 |
| Power amplifier 330a | Power amplifier 330b | Power amplifiers 330a & 330b |

In an exemplary design, PA module 150a may support four output power levels for each mode/band configuration. Table 2 lists the four output power levels and also provides the selected amplifiers (if any) for each output power level, in accordance with an exemplary design.

TABLE 2

Selected Amplifiers for each Output Power Level

| Output Power Level | CDMA Band 1 Configuration | CDMA Band 2 Configuration | GSM Configuration |
|---|---|---|---|
| High Power | Driver amplifier & Power amplifier 330a | Driver amplifier & Power amplifier 330b | Driver amplifier & Power amplifiers 330a and 330b |
| Medium Power | Power amplifier 330a | Power amplifier 330b | Power amplifier 330a |
| Low Power | Driver amplifier | Driver amplifier | Driver amplifier |
| Very Low Power | None | None | None |

In another exemplary design, the two CDMA configurations may support three output power levels (e.g., the high power, low power, and very low power levels in Table 2), and the GSM configuration may support the four output power levels in Table 2. In an exemplary design, driver amplifier 320 may be enabled whenever power amplifier 330a and/or 330b is enabled in the GSM configuration, so that driver amplifier 320 and power amplifier 330a are both enabled in the medium output power level. In general, any number of mode/band configurations may be supported, and any number of output power levels may be supported for each mode/band configuration. The same or different numbers of output power levels may be supported for different mode/band configurations. Each output power level for each mode/band configuration may be associated with any set of enabled amplifiers, if any. For clarity, much of the description below assumes the mode/band configurations and the output power levels shown in Table 2.

PA module 150a may support operation on one mode/band configuration at any given moment. PA module 150a may also support a particular output power level for the selected mode/band configuration. The switches and the states of driver amplifier 320 and power amplifiers 330a and 330b may be controlled to achieve the desired output power level for the selected mode/band configuration. Table 3 lists the state of each switch for the two CDMA configurations for each of the four output power levels. The state of each switch may be either "On" to indicate the switch is closed or "Off" to indicate the switch is opened.

TABLE 3

Switch Settings for CDMA Configurations

| | CDMA Band 1 | | | | CDMA Band 2 | | | |
| --- | --- | --- | --- | --- | --- | --- | --- | --- |
| Switches | High Power | Med Power | Low Power | Very Low Power | High Power | Med Power | Low Power | Very Low Power |
| S1 | On | Off | On | Off | On | Off | On | Off |
| S2 | Off | On | Off | On | Off | On | Off | On |
| S3 | Off | On | On | Off | Off | On | On | Off |
| S4A | On | On | Off | Off | Off | Off | Off | Off |
| S4B | Off | Off | Off | Off | On | On | Off | Off |
| S5A | Off | Off | On | On | Off | Off | Off | Off |
| S5B | Off | Off | Off | Off | Off | Off | On | On |
| S6A | On | On | Off | Off | Off | Off | Off | Off |
| S6B | Off | Off | Off | Off | On | On | Off | Off |
| S8A | On | On | On | On | Off | Off | Off | Off |
| S8B | Off | Off | Off | Off | On | On | On | On |
| Other Switches | Off | Off | Off | Off | Off | Off | Off | Off |

Table 4 lists the state of each switch for the GSM configuration for each of the four output power levels.

TABLE 4

Switch Settings for GSM Configuration

| | GSM Band 1 and 2 | | | |
| --- | --- | --- | --- | --- |
| Switches | High Power | Med Power | Low Power | Very Low Power |
| S1 | On | Off | On | Off |
| S2 | Off | On | Off | On |
| S3 | Off | On | On | Off |
| S4A | On | On | Off | Off |
| S4B | On | Off | Off | Off |
| S5C | Off | Off | On | On |
| S7A | On | On | Off | Off |
| S7B | On | Off | Off | Off |
| S8C | On | On | On | On |
| Other Switches | Off | Off | Off | Off |

Figure 4A:
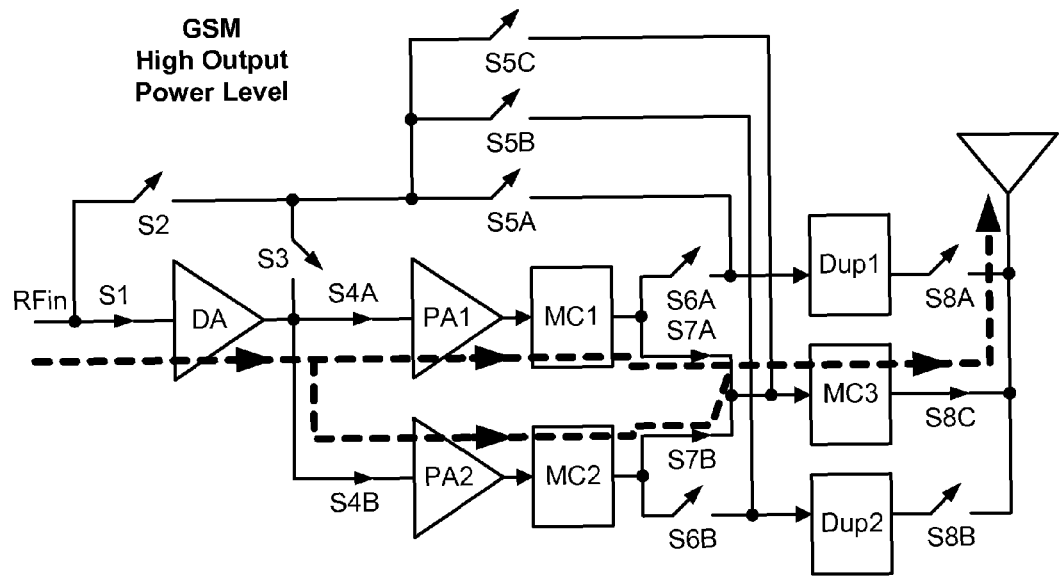
FIGS. 4A to 4D show signal paths for four output power levels.

FIG. 4A shows the signal path for the high output power level for GSM. For this output power level, the driver amplifier and power amplifiers PA1 and PA2 are all operational. The input RF signal is passed through switch S1, the driver amplifier, switches S4A and S4B, power amplifiers PA1 and PA2, matching circuits MC1 and MC2, switches S7A and S7B, matching circuit MC3, and switch S8C to antenna 152. All other switches are opened. Power amplifiers PA1 and PA2 typically have low output impedance, e.g., 3 to 6 Ohms. Matching circuits MC1 and MC2 terminate the low output impedance of power amplifiers PA1 and PA2, respectively, and provide 50 Ohms output impedance. The outputs of matching circuits MC1 and MC2 are coupled together via switches S7A and S7B and have an output impedance of 25 Ohms at node N5. Matching circuit MC3 provides conversion from 25 Ohms to 50 Ohms. Matching circuits MC1, MC2 and MC3 also attenuate undesired signal components at harmonic frequencies, which may be desirable since GSM has more stringent harmonic rejection requirements than CDMA.

Figure 4B:
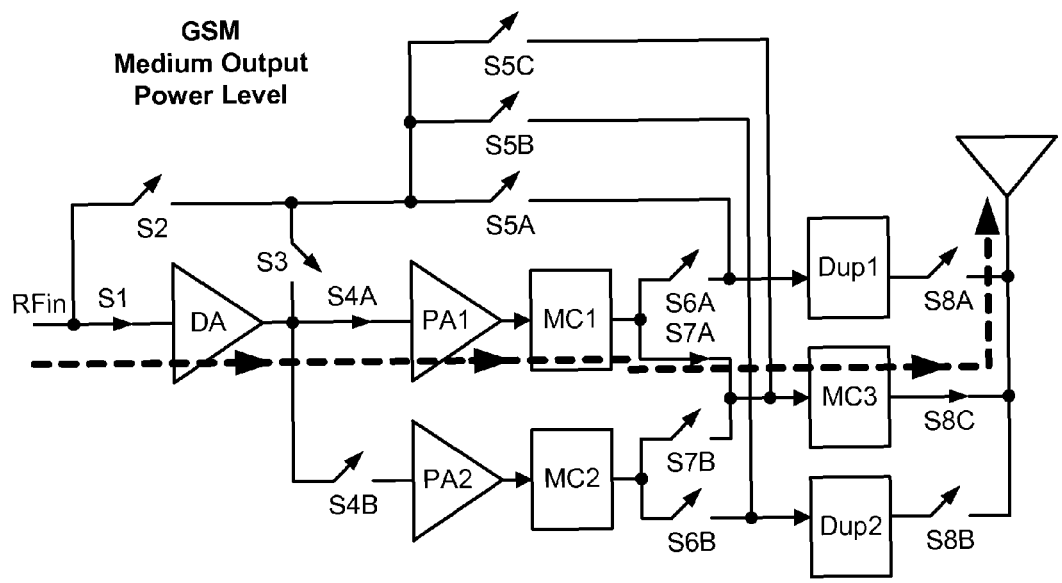

FIG. 4B shows the signal path for the medium output power level for GSM. For this output power level, the driver amplifier and power amplifier PA1 are operational, and power amplifier PA2 is disabled. The input RF signal is passed through switch S1, the driver amplifier, switch S4A, power amplifier PA1, matching circuit MC1, switch S7A, matching circuit MC3, and switch S8C to antenna 152. An impedance mismatch may occur at matching circuit MC3 since matching circuit MC2 is not connected. However, this mismatch may be acceptable at the medium output power level for GSM.

Figure 4C:
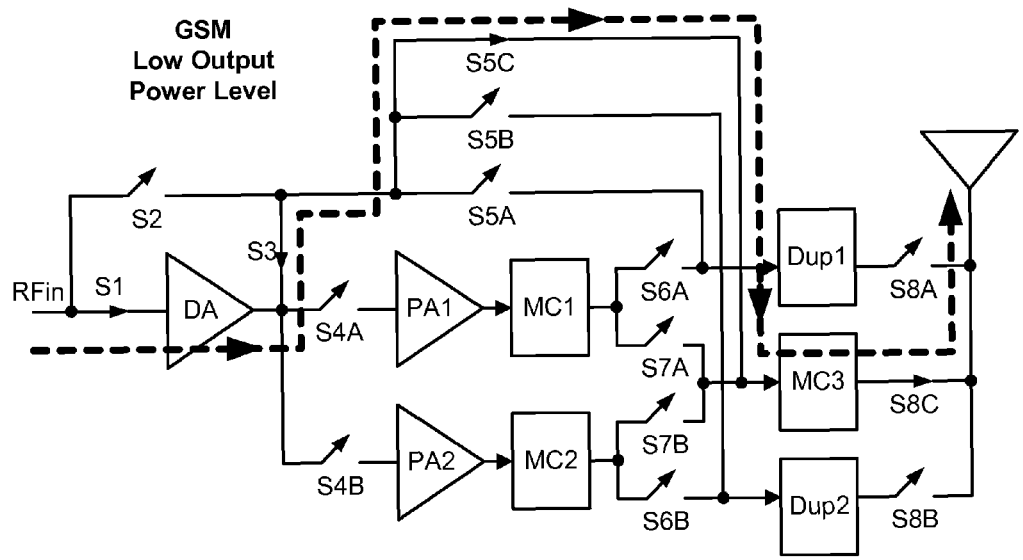

FIG. 4C shows the signal path for the low output power level for GSM. For this output power level, the driver amplifier is operational, and power amplifiers PA1 and PA2 are disabled. The input RF signal is passed through switch S1, the driver amplifier, switches S3 and S5C, matching circuit MC3, and switch S8C to antenna 152. The output impedance of the driver amplifier may be designed to match the impedance at node N5 (the input of matching circuit MC3) when power amplifiers PA1 and PA2 are both disabled. In this case, matching circuit MC3 may provide impedance matching and filtering for the driver amplifier for the low output power level for GSM.

Figure 4D:
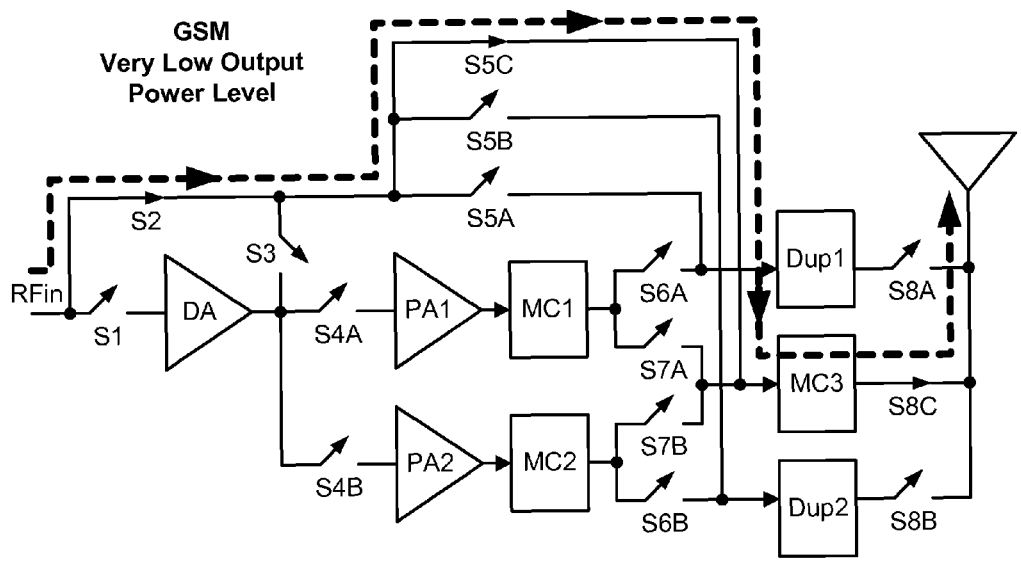

FIG. 4D shows the signal path for the very low output power level for GSM. For this output power level, the driver amplifier and power amplifiers PA1 and PA2 are all disabled. The input RF signal is passed through switches S2 and S5C, matching circuit MC3, and switch S8C to antenna 152.

Referring back to FIG. 3, for the high output power level for CDMA in Band 1, driver amplifier 320 and power amplifier 330a are operational, and power amplifier 330b is disabled. The input RF signal is passed through switch S1, driver amplifier 320, switch S4A, power amplifier 330a, matching circuit 340a, switch S6A, duplexer 350a, and switch S8A to antenna 152. For the medium output power level for CDMA in Band 1, power amplifier 330a is operational, and driver amplifier 320 and power amplifier 330b are disabled. The input RF signal is passed through switches S2, S3 and S4A, power amplifier 330a, matching circuit 340a, switch S6A, duplexer 350a, and switch S8A to antenna 152. For the low output power level for CDMA in Band 1, driver amplifier 320 is operational, and power amplifiers 330a and 330b are disabled. The input RF signal is passed through switch S1, driver amplifier 320, switches S3 and S5A, duplexer 350a, and switch S8A to antenna 152. For the very low output power level for CDMA in Band 1, driver amplifier 320 and power amplifiers 330a and 330b are all disabled. The input RF signal is passed through switches S2 and S5A, duplexer 350a, and switch S8A to antenna 152.

Tables 2, 3 and 4 show an exemplary design with four output power levels for each mode/band configuration. Fewer or more output power levels may also be supported. For example, only three output power levels comprising the high, medium, and low output power levels may be supported. Different amplifiers may also be selected for each mode/band configuration or each output power level. For example, driver amplifier 320 and power amplifier 330a may be selected for the medium output power level for GSM. The switches and the amplifiers may be operated based on how the output power levels are defined.

In general, each amplifier may have a fixed gain or a variable gain. In an exemplary design, each amplifier may provide a fixed gain when selected. Power control may be achieved by (i) selecting a proper output power level for coarse gain adjustment and (ii) varying a digital gain within data processor 110 or an analog gain within upconverter circuits for fine gain adjustment. The digital gain or the analog gain may cover a range of gains for each output power level.

In another exemplary design, driver amplifier 322 may have a programmable gain, which may be selected based on a gain control. Driver amplifier 322 may have $2^L$ gain steps of X dB/step, and a suitable gain step may be selected with an L-bit gain control. For example, L may be equal to 4 and X may be equal to 1. Driver amplifier 322 may then have 16 gain steps spaced apart by 1 dB, and one gain step may be selected with a 4-bit gain control. Fewer or more gain steps may also be supported. Power control may be achieved by selecting a proper output power level, selecting a proper gain for driver amplifier 322, and varying a digital gain within data processor 110 or an analog gain within upconverter circuits.

Figure 5:
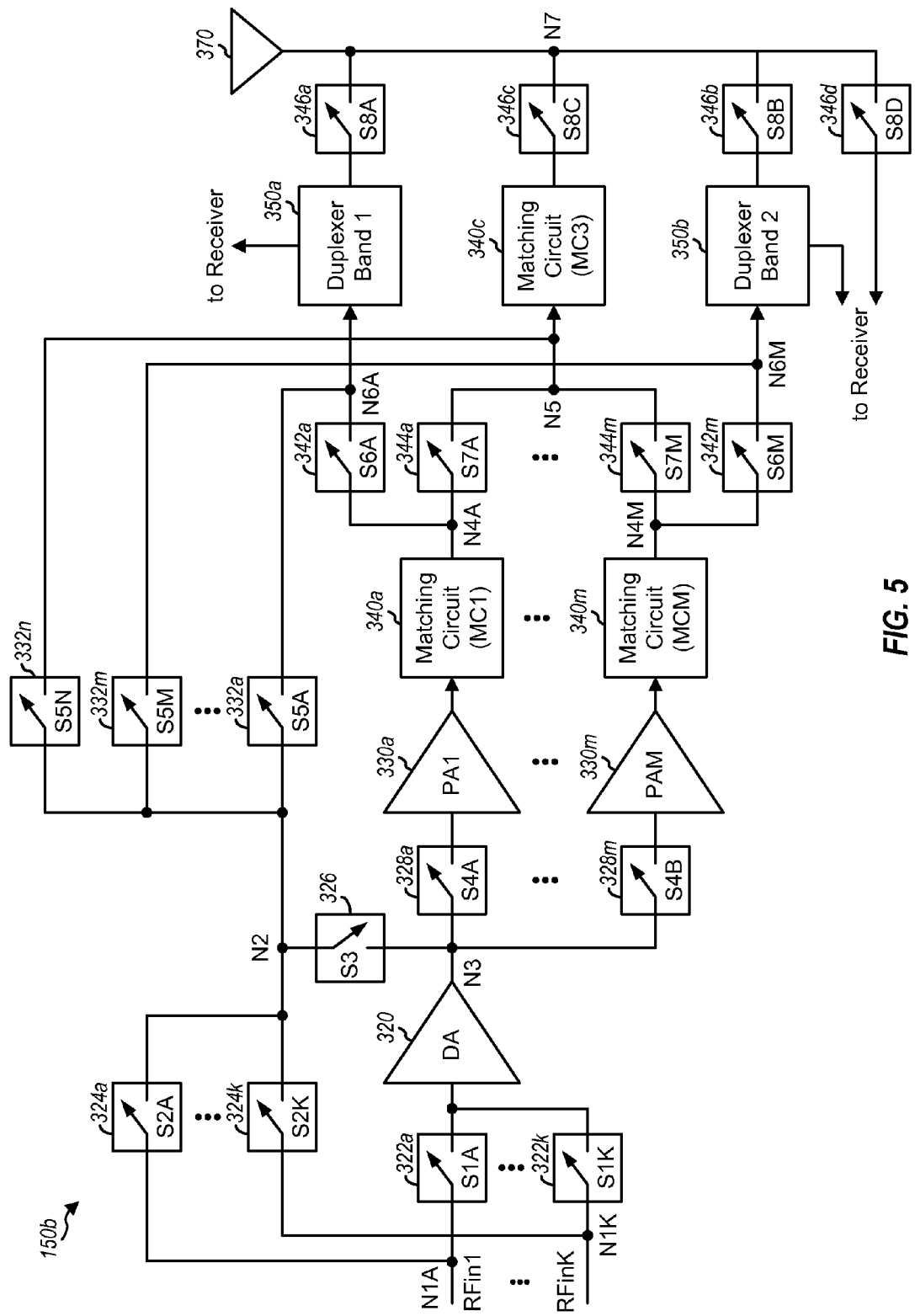
FIG. 5 shows a block diagram of another multi-mode multi-band PA module.

FIG. 5 shows a block diagram of an exemplary design of a multi-mode multi-band PA module 150b, which can also support multiple modes and multiple bands. PA module 150b is another exemplary design of PA module 150 in FIG. 1. Power amplifier 150b includes a single driver amplifier 320 and M power amplifiers 330a through 330m, where M 2.

PA module 150b includes most of the circuits and switches in PA module 150a in FIG. 3 with the following differences. K switches 322a through 322k have one end coupled to the input of driver amplifier 320 and the other end coupled to nodes N1A through N1K, respectively, where K≥1. K switches 324a through 324k have one end coupled to node N2 and the other end coupled to nodes N1A through N1K, respectively. K input RF signals RFin1 through RFinK are provided to nodes N1A through N1K, respectively. Upconverter circuits 140 may provide one input RF signal at any given moment. This input RF signal may be routed through one of K switches 322a through 322k to which the input RF signal is provided. The K input RF signals may be processed (e.g., filtered or amplified) in different manners by upconverter circuits 140 and/or by circuits within PA module 150b.

M switches 328a through 328m have one end coupled to node N3 and the other end coupled to the input of power amplifiers 330a through 330m, respectively. M matching circuits 340a through 340m are coupled to M power amplifiers 330a through 330m, respectively. M switches 332a through 332m have one end coupled to node N2 and the other end coupled to nodes N6A through N6M, respectively. Switch 332n is coupled between nodes N2 and N5. M switches 342a through 342m have one end coupled to the output of matching circuits 340a through 340m, respectively, and the other end coupled to nodes N6A through N6M, respectively. M switches 344a through 344m have one end coupled to node N5 and the other end coupled to the output of matching circuits 340a through 340m, respectively. Duplexers and/or other circuits may be coupled to nodes N6A through N6M.

The M power amplifiers 330a through 330m may support any number of modes and any number of bands. A number of mode/band configurations may be defined for the supported modes and bands. Each mode/band configuration may be supported with any number of power amplifiers and any one of the M power amplifiers. The M power amplifiers 330a through 330m may have the same or different maximum output power levels and may operate on one or more bands. Different mode/band configurations and different output power levels may be defined, e.g., as described above for FIG. 3. The switches and power amplifiers may be operated to implement all supported mode/band configurations and output power levels.

In general, a PA module may include any number of driver amplifiers and any number of power amplifiers. The driver amplifiers may have the same or different gains. The power amplifiers may have the same or different gains and the same or different maximum output power levels. The PA module may also support any number of modes and any number of bands. A number of mode/band configurations may be defined. Each mode/band configuration may cover one or more modes and one or more bands. For example, the CDMA configuration described above may cover CDMA 1X and WCDMA for one band, and the GSM configuration may cover GSM for multiple bands. Each mode/band configuration may be associated with a set of amplifiers that may be used for that mode/band configuration. Any number of output power levels may be supported for each mode/band configuration. Each output power level may be associated with zero, one, or more amplifiers being operational to obtain the desired output power level. Switches may be operated to select the enabled amplifiers, if any, and to bypass the unselected amplifiers, e.g., as described above.

Figure 6:
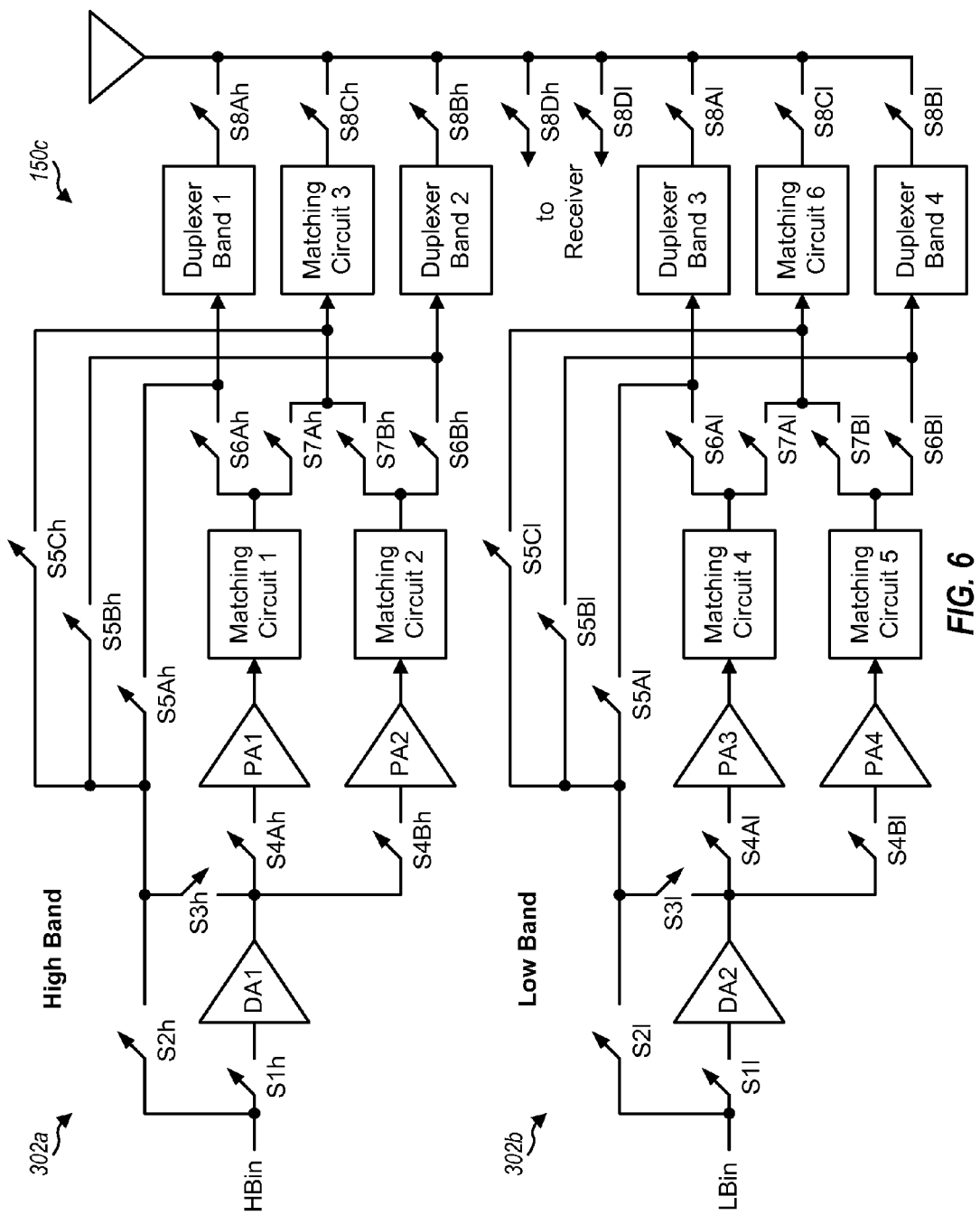
FIG. 6 shows a block diagram of yet another multi-mode multi-band PA module.

FIG. 6 shows a block diagram of an exemplary design of a multi-mode multi-band PA module 150c, which can also support multiple modes and multiple bands. PA module 150c is yet another exemplary design of PA module 150 in FIG. 1.

Power amplifier 150c includes two processing sections 302a and 302b for high band and low band, respectively. Each processing section 302 includes all of the amplifiers, switches, matching circuits, and duplexers shown in FIG. 3. The circuits in processing section 302a may be designed for high band. For example, transistors, capacitors, inductors, duplexers, and/or other circuits may be selected for high band. The circuits in processing section 302b may be designed for low band.

Processing sections 302a and 302b may support any number of modes and any number of bands in high band and low band, respectively. In the exemplary design shown in FIG. 6, both processing sections 302a and 302b share a single antenna. In this case, either low band or high band may be selected at any given moment, the processing section for the selected band may be enabled, and the processing section for the unselected band may be disabled. The switches, amplifiers, and matching circuits in the enabled processing section may be operated as described above for PA module 300 in FIG. 3.

Matching circuits 340 in FIGS. 3, 5 and 6 may perform impedance matching and filtering and may be implemented in various manners. Some exemplary designs of matching circuits 340 are described below.

Figure 7A:
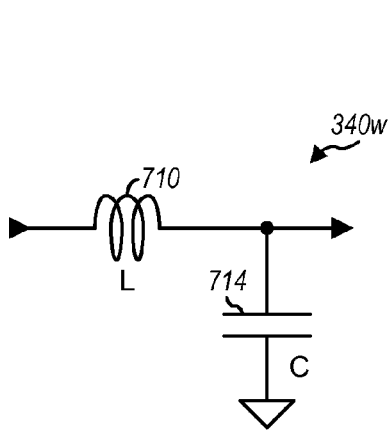
FIGS. 7A to 7D show schematic diagrams of four matching circuits.

FIG. 7A shows a schematic diagram of an exemplary design of a single-stage matching circuit 340w, which may be used for any one of matching circuits 340 in FIGS. 3, 5 and 6.

Within matching circuit 340w, an inductor 710 is coupled between the input and the output of matching circuit 340w. A capacitor 714 is coupled between the output of matching circuit 340w and circuit ground. The inductance L of inductor 710 and the capacitance C of capacitor 714 may be selected to obtain the nominal impedance matching at the maximum output power level and/or to obtain the desired filtering characteristics.

Figure 7B:
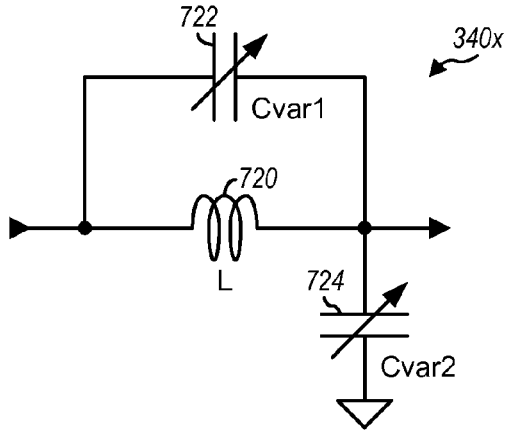

FIG. 7B shows a schematic diagram of an exemplary design of a single-stage tunable matching circuit 340x, which may also be used for any one of matching circuits 340 in FIGS. 3, 5 and 6. Within matching circuit 340x, an inductor 720 and a capacitor 722 are coupled in parallel, and the combination is coupled between the input and the output of matching circuit 340x. A capacitor 724 is coupled between the output of matching circuit 340x and circuit ground. Inductor 720 has a fixed inductance L, capacitor 722 has a variable capacitance Cvar1, and capacitor 724 has a variable capacitance Cvar2. The inductance L and capacitances Cvar1 and Cvar2 may be selected to obtain the nominal impedance matching at the maximum output power level. Different impedance matching settings may be obtained with different values of Cvar1 and Cvar2. Capacitors 722 and/or 724 may also be adjusted for different output power levels, for different power supply voltages, and/or for other factors to improve the efficiency of the power amplifier coupled to matching circuit 340x.

FIG. 7B shows an exemplary design with two variable capacitors 722 and 724. A single variable capacitor may also be used. For example, a tunable matching circuit may include a fixed capacitor 722 and a variable capacitor 724, or a variable capacitor 722 and a fixed capacitor 724.

Figure 7C:
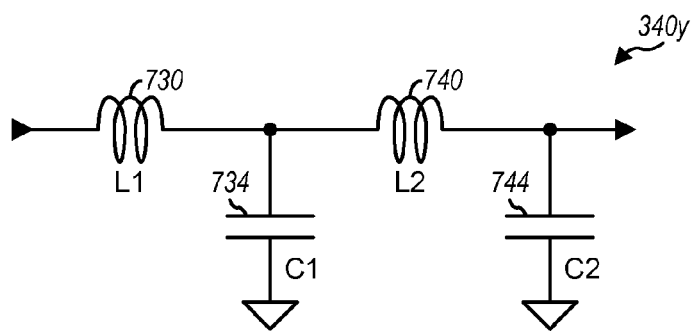

FIG. 7C shows a schematic diagram of an exemplary design of a two-stage matching circuit 340y, which may also be used for any one of matching circuits 340 in FIGS. 3, 5 and 6. Within matching circuit 340y, an inductor 730 is coupled between the input of matching circuit 340w and an intermediate node, and an inductor 740 is coupled between the intermediate node and the output of matching circuit 340y. A capacitor 734 is coupled between the intermediate node and circuit ground, and a capacitor 744 is coupled between the output of matching circuit 340y and circuit ground. The inductances L1 and L2 of inductors 730 and 740 and the capacitances C1 and C2 of capacitors 734 and 744 may be selected to obtain the nominal impedance matching at the maximum output power level and/or to obtain the desired filtering characteristics.

Figure 7D:
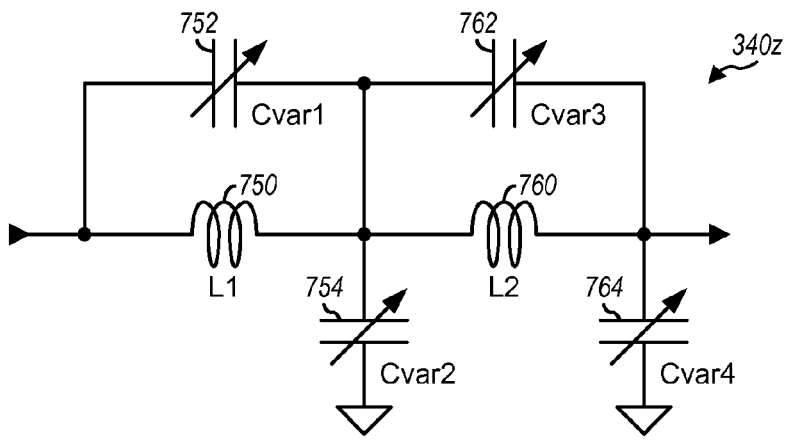

FIG. 7D shows a schematic diagram of an exemplary design of a two-stage tunable matching circuit 340z, which may also be used for any one of matching circuits 340 in FIGS. 3, 5 and 6. Within matching circuit 340z, an inductor 750 and a capacitor 752 are coupled in parallel, and the combination is coupled between the input of matching circuit 340z and an intermediate node. An inductor 760 and a capacitor 762 are coupled in parallel, and the combination is coupled between the intermediate node and the output of matching circuit 340z. A capacitor 754 is coupled between the intermediate node and circuit ground, and a capacitor 764 is coupled between the output of matching circuit 340z and circuit ground. Inductors 750 and 760 have fixed inductances L1 and L2, and capacitors 752, 754, 762 and 764 have variable capacitances Cvar1, Cvar2, Cvar3 and Cvar4, respectively. The inductances and the capacitances may be selected to obtain the nominal impedance matching at the maximum output power level. Different impedance matching settings may be obtained with different values of Cvar1, Cvar2, Cvar3 and Cvar4. Capacitors 752, 754, 762 and/or 764 may also be adjusted for different output power levels, for different power supply voltages, and/or for other factors to improve the efficiency of the power amplifier coupled to matching circuit 340z.

FIG. 7D shows an exemplary design with four variable capacitors. One, two, or three variable capacitors may also be used. For example, a tunable matching circuit may include fixed capacitors 752 and 762 and variable capacitors 754 and 764, or variable capacitors 752 and 762 and fixed capacitors 754 and 764.

The multi-mode multi-band PA module described herein may provide certain advantages. First, driver amplifiers, power amplifiers, matching circuits, and switches may be implemented in a single package with a small footprint. This may allow for a highly integrated low-cost multi-mode, multi-band wireless device. Second, driver amplifiers and power amplifiers may be shared by different modes and/or different bands to reduce the number of amplifiers needed to implement all modes and bands supported by the wireless device. For example, power amplifiers 330a and 330b in FIG. 3 may be designed for different bands for CDMA and may be reused for GSM to avoid a separate power amplifier for GSM. Third, switches may be used to select different combinations of amplifiers for different output power levels in order to achieve high PA efficiency at different output power levels for a given mode/band configuration. Fourth, the gains and possibly matching circuits may be configurable to achieve high PA efficiency across different modes, bands, and output power levels. Fifth, filtering for harmonic rejection may be integrated with impedance matching to reduce component count and facilitate integration. Sixth, switches to implement antenna switching may also be integrated to avoid a separate switchplexer module.

In an exemplary design, an apparatus (e.g., a wireless device, an integrated circuit, etc.) may include first and second power amplifiers, first and second matching circuits, and a plurality of switches. The first power amplifier (e.g., power amplifier 330a in FIG. 3) may receive a first input signal (e.g., Pin1) and provide power amplification for the first input signal when selected. The first matching circuit (e.g., matching circuit 340a) may be coupled to the first power amplifier, may perform impedance matching for the first power amplifier, and may provide a first output signal (e.g., RFout1). The second power amplifier (e.g., power amplifier 330b) may receive a second input signal (e.g., Pin2) and provide power amplification for the second input signal when selected. The second matching circuit (e.g., matching circuit 340b) may be coupled to the second power amplifier, may perform impedance matching for the second power amplifier, and may provide a second output signal (e.g., RFout2). The first and second matching circuits may further perform filtering to attenuate undesired signal components at harmonic frequencies. Each matching circuit may be implemented, e.g., as shown in FIG. 7A, 7B, 7C or 7D.

The plurality of switches (e.g., switches 328a to 344b) may be coupled to the first and second power amplifiers and the first and second matching circuits. The switches may configure the first and second power amplifiers to support a plurality of modes, with each mode being for a particular radio technology. Each power amplifier may support at least two modes. For example, the first power amplifier may support a first mode (e.g., CDMA 1X) and a second mode (e.g., GSM), and the second power amplifier may support the second mode and a third mode (e.g., WCDMA). The power amplifiers may also support other modes, e.g., LTE, WLAN, etc. In an exemplary design, the first and second input signals may be a common input signal. The switches may select zero, one, or both power amplifiers to perform power amplification for the common input signal.

The apparatus may further include a third matching circuit and first and second switches. The third matching circuit (e.g., matching circuit 340c) may be coupled to the first and second matching circuits, may receive the first and second output signals, and may provide a third output signal (e.g., RFout3). The first switch (e.g., switch 344a) may be coupled between the first matching circuit and the third matching circuit. The second switch (e.g., switch 344b) may be coupled between the second matching circuit and the third matching circuit. When the third output signal is selected, the first and second power amplifiers may receive a common input signal and provide power amplification for the common input signal. The third matching circuit may combine the outputs of the first and second power amplifiers to obtain higher output power and may also perform impedance matching for the first and second matching circuits.

The apparatus may further include a driver amplifier and at least one additional switch. The driver amplifier (e.g., driver amplifier 320) may be coupled to at least one of the first and second power amplifiers, may receive an input RF signal (e.g., RFin), and may provide signal amplification for the input RF signal when it is selected. The at least one switch (e.g., switches 322, 324 and 326) may be coupled to the driver amplifier and may operate to select or bypass the driver amplifier. The driver amplifier may support all of the modes and may provide the common input signal to the first and second power amplifiers. The driver amplifier may have a fixed gain or a variable gain. For example, the driver amplifier may have a plurality of gain settings, and one gain setting may be selected based on a target output power level.

In an exemplary design, multiple mode/band configurations may be supported with the driver amplifier and the two power amplifiers, and multiple output power levels may be supported for each mode/band configuration. In an exemplary design, for one mode/band configuration, the first and second power amplifiers and the driver amplifier may be selected for a first output power level. The first or second power amplifier may be selected and the driver amplifier may be unselected for a second output power level lower than the first output power level. The first and second power amplifiers may be unselected and the driver amplifier may be selected for a third output power level lower than the second output power level. The first and second power amplifiers and the driver amplifier may be unselected for a fourth output power level lower than the third output power level. The driver amplifier and power amplifiers may also be selected in other manners for other mode/band configurations, as described above. In another exemplary, the first or second power amplifier and the driver amplifier may be selected for the second output power level. In yet another exemplary design, the first, third and fourth output power levels may be supported for one mode/band configuration. Other output power levels may also be supported for a mode/band configuration.

The apparatus may further include switches for antenna switching. A first switch (e.g., switch 346a) may couple the first output signal to an antenna when the first output signal is selected. A second switch (e.g., switch 346b) may couple the second output signal to the antenna when the second output signal is selected. A third switch (e.g., switch 346c) may couple the third output signal to the antenna when the third output signal is selected. Additional switches may also be used to support additional modes and/or bands, TDD operation, etc.

The power amplifiers and matching circuits described above may support low band (or high band). The apparatus may further include another set of power amplifiers and matching circuits to support high band (or low band), e.g., as shown in FIG. 6.

Figure 8:
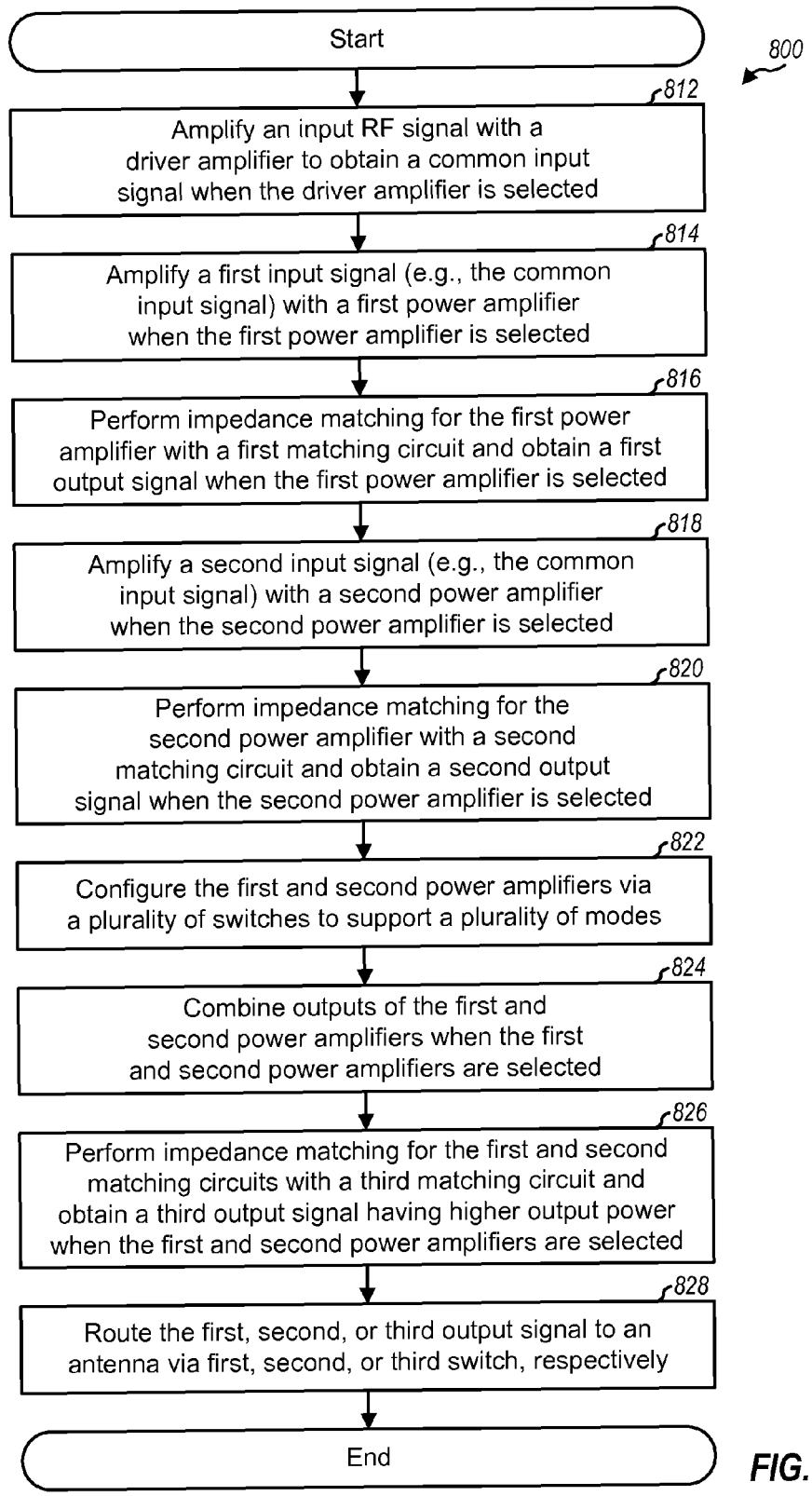
FIG. 8 shows a process for performing signal processing.

FIG. 8 shows an exemplary design of a process 800 for performing signal processing. An input RF signal may be amplified with a driver amplifier to obtain an amplified signal when the driver amplifier is selected (block 812). The driver amplifier may be selected or bypassed based on a selected output power level. The amplified signal may be provided as a common input signal for subsequent power amplifiers.

A first input signal (e.g., the common input signal) may be amplified with a first power amplifier when the first power amplifier is selected (block 814). Impedance matching may be performed for the first power amplifier with a first matching circuit to obtain a first output signal when the first power amplifier is selected (block 816). A second input signal (e.g., the common input signal) may be amplified with a second power amplifier when the second power amplifier is selected (block 818). In general, the first and second input signals may be different input signals or the same input signal. Furthermore, the first and second input signals may be generated based on a common input signal in various manners. For example, a driver amplifier may generate the common input signal, which may be provided as the first and second input signals. A common input signal may also be provided to two driver amplifiers, which may then provide the first and second input signals. In any case, impedance matching may be performed for the second power amplifier with a second matching circuit to obtain a second output signal when the second power amplifier is selected (block 820). The first and second power amplifiers may be configured via a plurality of switches to support a plurality of modes (block 822). Each mode may be for a particular radio technology, and each power amplifier may support at least two modes.

In an exemplary design, zero, one, or both power amplifiers may be selected to amplify the common input signal, e.g., depending on the selected mode and output power level. The driver amplifier may also be selected or bypassed based on the selected output power level.

In an exemplary design, the outputs of the first and second power amplifiers may be combined when the first and second power amplifiers are selected (block 824). Impedance matching for the first and second matching circuits may be performed with a third matching circuit to obtain a third output signal having higher output power when the first and second power amplifiers are selected (block 826). Filtering may also be performed with the first, second, and third matching circuits to attenuate undesired signal components at harmonic frequencies. The first, second, or third output signal may be routed to an antenna via first, second, or third switch, respectively (block 828).

The PA module described herein may be implemented on an IC, an analog IC, an RFIC, a mixed-signal IC, an ASIC, a printed circuit board (PCB), an electronics device, etc. The PA module may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), etc.

An apparatus implementing the PA module described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus for signal processing, comprising:
    a first power amplifier receiving a first input signal and providing power amplification for the first input signal when the first power amplifier is selected;
    a first matching circuit coupled to the first power amplifier and providing a first output signal;
    a second power amplifier receiving a second input signal and providing power amplification for the second input signal when the second power amplifier is selected;
    a second matching circuit coupled to the second power amplifier and providing a second output signal; and
    a plurality of switches coupled to the first and second power amplifiers and the first and second matching circuits, the plurality of switches configuring the first and second power amplifiers to support a plurality of modes, each mode being for a particular radio technology, and each power amplifier supporting at least two modes.

2. The apparatus of claim 1, the first and second input signals being a common input signal, and the plurality of switches selecting zero, one, or both of the first and second power amplifiers to perform power amplification for the common input signal.

3. The apparatus of claim 1, the first matching circuit performing impedance matching for the first power amplifier, the second matching circuit performing impedance matching for the second power amplifier, and the first and second matching circuits further performing filtering to attenuate undesired signal components at harmonic frequencies.

4. The apparatus of claim 1, further comprising:
    a third matching circuit coupled to the first and second matching circuits, the third matching circuit receiving the first and second output signals and providing a third output signal.

5. The apparatus of claim 4, the first and second power amplifiers receiving a common input signal as the first and second input signals and providing power amplification for the common input signal when the third output signal is selected, and the third matching circuit combining outputs of the first and second power amplifiers to obtain higher output power and performing impedance matching for the first and second matching circuits when the third output signal is selected.

6. The apparatus of claim 4, further comprising:
    a first switch coupled between the first matching circuit and the third matching circuit; and
    a second switch coupled between the second matching circuit and the third matching circuit, the first and second switches being closed when the third output signal is selected.

7. The apparatus of claim 1, further comprising:
    a driver amplifier coupled to at least one of the first and second power amplifiers, the driver amplifier receiving an input radio frequency (RF) signal and providing signal amplification for the input RF signal when the driver amplifier is selected.

8. The apparatus of claim 7, further comprising:
    at least one switch coupled to the driver amplifier and operated to select or bypass the driver amplifier.

9. The apparatus of claim 7, the driver amplifier supporting the plurality of modes and providing a common input signal as the first and second input signals for the first and second power amplifiers.

10. The apparatus of claim 7, the driver amplifier having a plurality of gain settings, and one of the plurality of gain settings being selected based on a target output power level.

11. The apparatus of claim 7, the first and second power amplifiers and the driver amplifier being selected for a first output power level.

12. The apparatus of claim 11, one of the first and second power amplifiers being selected and the driver amplifier being selected or unselected for a second output power level lower than the first output power level.

13. The apparatus of claim 11, the first and second power amplifiers being unselected and the driver amplifier being selected for a second output power level lower than the second output power level, and the first and second power amplifiers and the driver amplifier being unselected for a third output power level lower than the second output power level.

14. The apparatus of claim 1, the first power amplifier supporting a first mode and a second mode, and the second power amplifier supporting the second mode and a third mode.

15. The apparatus of claim 14, the first mode being for Code Division Multiple Access (CDMA) 1X, the second mode being for Global System for Mobile Communications (GSM), and the third mode being for Wideband CDMA (WCDMA).

16. The apparatus of claim 4, further comprising:
a first switch coupling the first output signal to an antenna when the first output signal is selected;
a second switch coupling the second output signal to the antenna when the second output signal is selected; and
a third switch coupling the third output signal to the antenna when the third output signal is selected.

17. The apparatus of claim 1, further comprising:
a third power amplifier receiving a third input signal and providing power amplification for the third input signal when the third power amplifier is selected;
a third matching circuit coupled to the third power amplifier and providing a third output signal;
a fourth power amplifier receiving a fourth input signal and providing power amplification for the fourth input signal when the fourth power amplifier is selected;
a fourth matching circuit coupled to the fourth power amplifier and providing a fourth output signal; and
a second plurality of switches coupled to the third and fourth power amplifiers and the third and fourth matching circuits, the second plurality of switches configuring the third and fourth power amplifiers to support the plurality of modes for high band, and the first and second power amplifiers supporting the plurality of modes for low band.

18. A wireless device comprising:
a power amplifier (PA) module comprising
a first power amplifier receiving a first input signal and providing power amplification for the first input signal when the first power amplifier is selected,
a first matching circuit coupled to the first power amplifier and providing a first output signal,
a second power amplifier receiving a second input signal and providing power amplification for the second input signal when the second power amplifier is selected,
a second matching circuit coupled to the second power amplifier and providing a second output signal, and
a plurality of switches coupled to the first and second power amplifiers and the first and second matching circuits, the plurality of switches configuring the first and second power amplifiers to support a plurality of configurations, each configuration covering at least one mode and at least one band, each mode being for a particular radio technology, and each power amplifier switchably supporting at least two modes; and
an antenna coupled to the PA module and transmitting the first output signal when a first configuration is selected and transmitting the second output signal when a second configuration is selected.

19. The wireless device of claim 18, the PA module further comprising a third matching circuit coupled to the first and second matching circuits, the third matching circuit receiving and combining the first and second output signals and providing a third output signal for transmission via the antenna when a third configuration is selected.

20. The wireless device of claim 18, the PA module further comprising a driver amplifier coupled to at least one of the first and second power amplifiers, the driver amplifier receiving an input radio frequency (RF) signal and providing signal amplification for the input RF signal when the driver amplifier is selected.

21. A method of performing signal processing, comprising:
amplifying a first input signal with a first power amplifier when the first power amplifier is selected;
performing impedance matching for the first power amplifier with a first matching circuit and obtaining a first output signal when the first power amplifier is selected;
amplifying a second input signal with a second power amplifier when the second power amplifier is selected;
performing impedance matching for the second power amplifier with a second matching circuit and obtaining a second output signal when the second power amplifier is selected; and
configuring the first and second power amplifiers via a plurality of switches to support a plurality of modes, each mode being for a particular radio technology, and each power amplifier supporting at least two modes.

22. The method of claim 21, further comprising:
generating the first and second input signals for the first and second power amplifiers based on a common input signal; and
selecting zero, one, or both of the first and second power amplifiers to amplify the common input signal.

23. The method of claim 21, further comprising:
combining outputs of the first and second power amplifiers when the first and second power amplifiers are selected; and
performing impedance matching for the first and second matching circuits with a third matching circuit and obtaining a third output signal having higher output power when the first and second power amplifiers are selected.

24. The method of claim 21, further comprising:
performing filtering with the first, second, and third matching circuits to attenuate undesired signal components at harmonic frequencies.

25. The method of claim 21, further comprising:
amplifying an input radio frequency (RF) signal with a driver amplifier to obtain a common input signal when the driver amplifier is selected; and
providing the common input signal as the first and second input signals for the first and second power amplifiers.

26. The method of claim 25, further comprising:
selecting or bypassing the driver amplifier based on a selected output power level in a plurality of output power levels.

27. The method of claim 23, further comprising:
routing the first, second, or third output signal to an antenna via first, second, or third switch, respectively.

28. An apparatus for signal processing, comprising:
first means for amplifying a first input signal when the first means for amplifying is selected;
first means for performing impedance matching for the first means for amplifying and obtaining a first output signal when the first means for amplifying is selected;
second means for amplifying a second input signal when the second means for amplifying is selected;
second means for performing impedance matching for the second means for amplifying and obtaining a second output signal when the second means for amplifying is selected; and
means for switchably configuring the first and second means for amplifying to support a plurality of modes, each mode being for a particular radio technology, and each means for amplifying supporting at least two modes.

* * * * *